United States Patent
Izawa

(10) Patent No.: US 11,059,996 B2
(45) Date of Patent: Jul. 13, 2021

(54) PRODUCTION METHOD OF POLISHING COMPOSITION

(71) Applicant: FUJIMI INCORPORATED, Kiyosu (JP)

(72) Inventor: Yoshihiro Izawa, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/133,186

(22) Filed: Sep. 17, 2018

(65) Prior Publication Data

US 2019/0085210 A1 Mar. 21, 2019

(30) Foreign Application Priority Data

Sep. 21, 2017 (JP) .............................. JP2017-181451

(51) Int. Cl.
| | |
|---|---|
| *C09G 1/02* | (2006.01) |
| *C09G 1/04* | (2006.01) |
| *C09K 3/14* | (2006.01) |
| *H01L 21/304* | (2006.01) |
| *H01L 21/306* | (2006.01) |

(52) U.S. Cl.
CPC .................. *C09G 1/02* (2013.01); *C09G 1/04* (2013.01); *C09K 3/1409* (2013.01); *C09K 3/1454* (2013.01); *C09K 3/1463* (2013.01); *H01L 21/304* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 6,045,605 A | 4/2000 | Doi et al. | |
| 2006/0245995 A1* | 11/2006 | Yoshida | .................... C09G 1/02 423/326 |
| 2007/0167116 A1* | 7/2007 | Yoshida | ................ B24B 37/044 451/41 |
| 2017/0298253 A1 | 10/2017 | Ishida | |

FOREIGN PATENT DOCUMENTS

| | | | |
|---|---|---|---|
| JP | H10-321570 A | | 12/1998 |
| JP | 2008179762 | * | 7/2008 |
| JP | 2016-069438 A | | 5/2016 |
| WO | 2015129776 | * | 9/2015 |

OTHER PUBLICATIONS

Office Action issued in corresponding Japanese Patent Application No. 2017-181451 dated Mar. 30, 2021 with English translation.

* cited by examiner

*Primary Examiner* — Stephanie P Duclair
(74) *Attorney, Agent, or Firm* — Foley & Lardner LLP

(57) ABSTRACT

A method for producing a polishing composition including: preparing a first dispersion liquid by mixing a dispersing element containing abrasive grains and a dispersing medium with a pH adjusting agent, and changing the pH of the dispersing element so as to pass an isoelectric point of the abrasive grains; and preparing a second dispersion liquid by mixing the first dispersion liquid with an electrical conductivity adjusting agent.

3 Claims, No Drawings

PRODUCTION METHOD OF POLISHING COMPOSITION

BACKGROUND

1. Technical Field

The present invention relates to a method for producing a polishing composition.

2. Description of Related Arts

In recent years, a so-called chemical mechanical polishing (CMP) technique for polishing and flattening a semiconductor substrate in producing a device has been used in accordance with multilayer wiring on a surface of a semiconductor substrate. CMP is a method for flattening the surface of a polishing object (object to be polished) like a semiconductor substrate by using a composition (slurry) containing abrasive grains such as silica, alumina, or ceria, an anticorrosion agent, a surfactant, or the like. The polishing object (object to be polished) is silicon, polysilicon, silicon oxide film (silicon oxide), silicon nitride, a wiring or a plug which consists of metal, or the like.

For example, as a CMP slurry for polishing a substrate containing oxygen and silicon atoms such as silicon oxide, JP 2016-69438 A (corresponding to US 2017/298253 A) discloses a composition containing colloidal silica (abrasive grains), an organic acid, and a conjugate base of the organic acid.

SUMMARY

However, in the composition described in JP 2016-69438 A (corresponding to US 2017/298253 A), it was found that abrasive grains can be aggregated during preparation of the composition.

Accordingly, an object of the present invention is to provide a method for producing a polishing composition capable of suppressing aggregation of abrasive grains.

To solve the above problem, the inventors of the present invention conducted intensive studies. As a result, it was found that the above problem can be solved by a production method of a polishing composition including: preparing a first dispersion liquid by mixing a dispersing element including abrasive grains and a dispersing medium with a pH adjusting agent, and changing a pH of the dispersing element so as to pass an isoelectric point of the abrasive grains; and preparing a second dispersion liquid by mixing the first dispersion liquid with an electrical conductivity adjusting agent.

DETAILED DESCRIPTION

Hereinbelow, an embodiment of the present invention will be described. The present invention will not be limited to the following embodiments. Unless otherwise specified, operations and measurements of physical properties or the like are carried out at room temperature (20 to 25° C.)/relative humidity of 40 to 50% RH.

<<Method for Producing Polishing Composition>>

One embodiment of the present invention is a method for producing a polishing composition, including a step of preparing a first dispersion liquid by mixing a dispersing element including abrasive grains and a dispersing medium (in the present description, also simply referred to as "dispersing element") with a pH adjusting agent, and changing the pH of the dispersing element so as to pass an isoelectric point of the abrasive grains, and a step of preparing a second dispersion liquid by mixing the first dispersion liquid with an electrical conductivity adjusting agent. According to this structure, the production method of the polishing composition according to the present embodiment can suppress aggregation of abrasive grains.

The mechanism achieving the above-described effect is likely as follows.

The inventors found that abrasive grains may aggregate in some cases when obtaining the composition containing abrasive grains, an acid, and a salt of the acid described in JP 2016-69438 A (corresponding to US 2017/298253 A). Therefore, as a result of study, the inventors considered the reason of aggregation of abrasive grains as follows: when a dispersing element containing abrasive grains and an acid or alkaline salt are mixed, the electric double layer on the surface of the abrasive grains is compressed, the repulsive force between the abrasive grains before and after passing the isoelectric point of the abrasive grains decreases, and thus the abrasive grains aggregates when the isoelectric point of the abrasive grains is passed during adjustment of the pH. Accordingly, they found that aggregation of abrasive grains can be suppressed by changing the pH of the dispersing element containing abrasive grains so as to pass the isoelectric point of the abrasive grains, and then adding an acid or alkaline salt, and further found that time-dependent aggregation of the abrasive grains contained in the polishing composition thus produced is also suppressed. Additionally, they also made the following finding: mixing of the dispersing element containing abrasive grains with an acidic or alkaline salt weakens the repulsive force between the abrasive grains, so that abrasive grains can aggregate after passing through the isoelectric point of the abrasive grains for adjusting the pH because of the weak repulsive force for dispersing abrasive grains. Based on the above-described finding, the present invention has been completed.

Such a mechanism is merely a presumption, and, needless to say, will not limit the technical scope of the present invention.

In the present description, "polishing" includes not only a process of flattening the surface of the object to be polished (CMP process), but also a surface treatment process after the CMP process, for example, rinse polishing or cleaning of the object to be polished after polishing. That is, the polishing composition according to the present invention can be used both in the CMP process and in the surface treatment process.

1. Step of preparing a first dispersion liquid by mixing a dispersing element including abrasive grains and a dispersing medium with a pH adjusting agent, and changing a pH of the dispersing element so as to pass an isoelectric point of the abrasive grains The production method of the present invention includes a step of preparing a first dispersion liquid by mixing a dispersing element including abrasive grains and a dispersing medium with a pH adjusting agent, and changing a pH of the dispersing element so as to pass through an isoelectric point of the abrasive grains.

(Dispersing Element Containing Abrasive Grains and Dispersing Medium)

[Abrasive Grains]

The abrasive grains contained in the dispersing element are not particularly limited as long as having an isoelectric point. Examples of the abrasive grains include particles made of metal oxides of silica, alumina, ceria, titania or the like, silicon nitride particles, silicon carbide particles, and boron nitride particles. The abrasive grains may be used alone or in combination of two or more kinds of abrasive grains as long as the effect of the present invention is not impaired. Additionally, the abrasive grains may be a commercial product or synthetic product.

The abrasive grains are preferably selected from silica, alumina, and ceria, and more preferably silica. The silica, alumina, and ceria are preferably colloidal silica or fumed silica, colloidal alumina, and colloidal ceria, respectively.

In one embodiment of the present invention, the abrasive grains are preferably silica, and more preferably colloidal silica.

A size of the abrasive grains is not particularly limited. An average primary particle size of the abrasive grains is preferably from 5 nm to 100 nm. The average primary particle size of the abrasive grains can be calculated by, for example, a BET method.

An average secondary particle size of the abrasive grains is preferably 10 nm or more, more preferably 20 nm or more, further preferably 30 nm or more, and even more preferably 50 nm or more. The average secondary particle size of the abrasive grains is preferably 200 nm or less, more preferably 150 nm or less, further preferably 100 nm or less, and even more preferably 90 nm or less. In the present description, the average secondary particle size of the abrasive grains can be measured by, for example, a dynamic light scattering method.

A content of the abrasive grains contained in the dispersing element is not particularly limited, and can be adjusted as appropriate according to a process (CMP process, surface treatment process) which uses the polishing composition produced by the production method according the present embodiment.

The surface of the abrasive grains may be modified. As for a method for modifying the surface of the abrasive grains, a known method can be used.

[Dispersing Medium]

The dispersing element according to the present invention includes a dispersing medium for dispersing the abrasive grains. Examples of the dispersing medium include water; alcohols such as methanol, ethanol, and ethylene glycol; ketones such as acetone, and mixtures thereof. Among them, the dispersing medium is preferably water. The water is preferably water containing minimum impurities, and, specifically, preferably pure water or ultrapure water from which impurity ions have been removed with an ion exchange resin, and then foreign matter has been removed by filtration, or distilled water.

[Dispersing Element]

The dispersing element according to the present invention includes the abrasive grains and the dispersing medium. The method for producing the dispersing element is not particularly limited, and may be obtained by, for example, stirring and mixing the abrasive grains in the dispersing medium.

The content of the abrasive grains in the dispersing element can be adjusted as appropriate to the content of the abrasive grains in the below-described polishing composition.

A pH of the dispersing element may be adjusted as appropriate to the value which will not cause aggregation of abrasive grains, according to the abrasive grains to be used. For example, when colloidal silica as the abrasive grains and water as the dispersing medium are used, the pH of the dispersing element is about 7.

(pH Adjusting Agent)

The pH adjusting agent may be any appropriate acidic or alkaline compound (excluding those in the form of a salt). Additionally, the pH adjusting agent may be either an inorganic compound or an organic compound.

The acidic compound is not particularly limited, and may be selected from known acids. Examples of the acid include inorganic acids such as sulfuric acid, nitric acid, boric acid, carbonic acid, hypophosphorous acid, phosphorous acid, and phosphoric acid; and organic acids such as carboxylic acids, for example, formic acid, acetic acid, propionic acid, butyric acid, valeric acid, 2-methylbutyric acid, n-hexanoic acid, 3,3-dimethylbutyric acid, 2-ethyl butyric acid, 4-methylpentanoic acid, n-heptanoic acid, 2-methylhexanoic acid, n-octanoic acid, 2-ethyl hexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid and lactic acid; organic sulfuric acids, for example, methanesulfonic acid, ethanesulfonic acid, and isethionic acid; and organophosphorus acids, for example, phytic acid, and hydroxyethylidene diphosphonic acid. The acid may be used alone or in combination of two or more of them.

In one embodiment of the present invention, the pH adjusting agent is an acidic compound, preferably at least one selected from the group consisting of phosphoric acid, acetic acid, maleic acid, and nitric acid, more preferably phosphoric acid or acetic acid, and even more preferably phosphoric acid.

The alkaline compound is not particularly limited, and examples include known alkalis. Examples of the alkaline include alkaline metal hydroxides such as potassium hydroxide, and amines such as ammonia, ethylenediamine, and piperazine. The alkaline may be used alone or in combination of two or more kinds of them.

In one embodiment of the present invention, the pH adjusting agent is an alkaline compound, and preferably ammonia from the viewpoint of preventing metal contamination of the object to be polished.

(Preparation of First Dispersion Liquid)

In the present step, the dispersing element including abrasive grains and dispersing medium, and the pH adjusting agent are mixed, a pH of the dispersing element is changed so as to pass through an isoelectric point of the abrasive grains, thereby preparing the first dispersion liquid.

In the present description, "a pH of the dispersing element is change so as to pass through an isoelectric point of abrasive grains" means that the zeta potential of abrasive grains is changed from positive to negative, or from negative to positive.

Accordingly, "a pH of the dispersing element is change so as to pass through an isoelectric point of abrasive grains" specifically means that (i) when the pH of the dispersing element is higher than the isoelectric point of the abrasive grains (the pH value at which the zeta potential of the abrasive grains is zero), a pH adjusting agent (for example, an acid) is mixed with the dispersing element, thereby making the pH of the dispersing element lower than the isoelectric point of the abrasive grains; or (ii) when the pH of the dispersing element is lower than the isoelectric point of the abrasive grains, a pH adjusting agent (for example, an alkali) is mixed with the dispersing element, thereby making the pH of the dispersing element higher than the isoelectric point of the abrasive grains.

The isoelectric point of the abrasive grains is determined by, for example, measuring a zeta potential of abrasive grains from pH 2.0 to 10.0 in increments of 1.0, and calculating a pH value of an isoelectric point by the following formula using pH values before and after a change of sign of the zeta potential and the zeta potential at the pH values before and after the change.

$$\text{pH of isoelectric point} = \frac{\alpha \times \zeta_\beta - \beta \times \zeta_\alpha}{\zeta_\beta - \zeta_\alpha} \qquad \text{[Mathematical Fomula 1]}$$

α and β: pH values before and after a change of sign of zeta potential
$\zeta_\alpha$: zeta potential at pH value α
$\zeta_\beta$: zeta potential at pH value β

In the abrasive grains, for example, the isoelectric point of silica is about pH 3, the isoelectric point of alumina is about pH 9, and the isoelectric point of ceria is about pH 7.

The method for mixing the dispersing element and the pH adjusting agent is not particularly limited, and a known method can be used. For example, it is preferred that the pH adjusting agent be added while the dispersing element is being stirred. At that time, the pH adjusting agent is preferably added at a time in an amount which can pass through without remaining at the isoelectric point of the abrasive grains.

The temperature during mixing the dispersing element and the pH adjusting agent is not particularly limited, but is preferably 10 to 40° C. Additionally, the mixing time is also not particularly limited.

The pH value of the first dispersion liquid is adjusted as appropriate by usage of the pH adjusting agent, so as to be lower or higher than the isoelectric point of the abrasive grains contained in the dispersing element. The pH value of the first dispersion liquid is preferably about ±2.0 the isoelectric point of the abrasive grains, and/or at the value where the absolute value of the zeta potential of the abrasive grains is about 10 mV or more. When the pH value is within these ranges, aggregation of abrasive grains can be further suppressed.

As described above, the first dispersion liquid is prepared.

2. Step of mixing the first dispersion liquid and an electrical conductivity adjusting agent to prepare a second dispersion liquid The production method of the present invention includes a step of mixing the first dispersion liquid and an electrical conductivity adjusting agent to prepare a second dispersion liquid.

(Electrical Conductivity Adjusting Agent)

The electrical conductivity adjusting agent is used for increasing an electrical conductivity of the polishing composition produced, thereby suppressing time-dependent aggregation of abrasive grains (colloid stability) contained in the polishing composition.

The electrical conductivity adjusting agent can be an electrolyte, and a salt of an acidic compound or a salt of an alkaline compound can be used as the electrolyte.

As the salt of an acidic compound, a salt of the acid used in the pH adjusting agent can be used, and examples of a counter ion which forms a salt with the acidic compound include an ammonium ion, a quaternary ammonium ion, a sodium ion, a potassium ion, a lithium ion, a rubidium ion, a cesium ion, a magnesium ion, and a calcium ion.

As the salt of an alkaline compound, an alkaline salt used in the pH adjusting agent can be used, and examples of the salt include a carbonate, a hydrogencarbonate, a sulfate, and an acetate.

When the pH adjusting agent used in the step of preparing the first dispersion liquid is an acidic compound, a salt of an acidic compound is used as the electrical conductivity adjusting agent, and it is preferable to use the salt of the acidic compound used as a pH adjusting agent, from the viewpoint of colloid stability.

That is, in one preferred embodiment of the present invention, when the pH adjusting agent is phosphoric acid, the electrical conductivity adjusting agent is selected from diammonium hydrogen phosphate, ammonium dihydrogen phosphate, hydrogen disodium phosphate, sodium dihydrogen phosphate, dipotassium hydrogen phosphate, and potassium dihydrogen phosphate, and is preferably diammonium hydrogen phosphate; when the pH adjusting agent is acetic acid, the electrical conductivity adjusting agent is selected from ammonium acetate, potassium acetate, and sodium acetate.

When the pH adjusting agent used in the step of preparing the first dispersion liquid is an alkaline compound, the electrical conductivity adjusting agent is a salt of an alkaline compound, and is preferably a salt of the alkaline compound used as the pH adjusting agent, from the viewpoint of colloid stability.

The form of the electrical conductivity adjusting agent is not particularly limited, and may be in the form of a solid or an aqueous solution. From the viewpoint of further suppressing aggregation of abrasive grains, the electrical conductivity adjusting agent is preferably in the form of an aqueous solution. Additionally, when the electrical conductivity adjusting agent is in the form of an aqueous solution, the concentration of the electrical conductivity adjusting agent is preferably 0.1 to 10% by mass.

(Preparation of Second Dispersion Liquid)

A method for mixing the first dispersion liquid and the electrical conductivity adjusting agent is not particularly limited, and a known method can be used; for example, it is preferred that the electrical conductivity adjusting agent be added while the first dispersion liquid is stirred.

A usage of the electrical conductivity adjusting agent is 0.5 to 10 parts by mass, and preferably 1 to 5 parts by mass with reference to 100 parts by mass of the first dispersion liquid.

A temperature during mixing the first dispersion liquid and the electrical conductivity adjusting agent is not particularly limited, but is preferably 10 to 40° C. Additionally, the mixing time is also not particularly limited.

As described above, the second dispersion liquid is prepared.

<Polishing Composition>

In the production method of the present invention, the second dispersion liquid may be used as a polishing composition as it is, or may be subjected to another step before used as a polishing composition.

In the production method of the present invention, aggregation of abrasive grains during preparation of the polishing composition can be suppressed. In the present description, "suppression of aggregation of abrasive grains" means reduction of the amount of the abrasive grains which are larger than a certain size (aggregated abrasive grains) in the produced polishing composition. For example, in the CMP process, it means that defects (including scratches and particles) caused during polishing of the object to be polished can be reduced by decreasing the amount of the aggregated abrasive grains. Additionally, for example, in the surface treatment process, it means particles caused during surface treatment of the object to be subjected to surface treatment can be reduced.

As described above, the polishing composition according to the present invention can be used in both of the CMP process and the surface treatment process.

When used in the CMP process, the lower limit of the content of the abrasive grains contained in the polishing composition is preferably 0.01% by mass or more, and more preferably 0.02% by mass or more with reference to the polishing composition. The upper limit of the content of the abrasive grains is preferably 10% by mass or less, more preferably 5% by mass or less, and even more preferably 2% by mass or less with reference to the polishing composition. When these ranges are satisfied, a marked removal rate can be achieved while the cost is suppressed. When the polishing composition includes two or more types of abrasive grains, the content of the abrasive grains means the total amount of them.

When used in the surface treatment process, the lower limit of the content of the abrasive grains contained in the polishing composition is preferably 0.001% by mass or more, more preferably 0.01% by mass or more, and even more preferably 0.05% by mass or more with reference to the polishing composition. The upper limit of the content of the abrasive grains is preferably 1% by mass or less, more preferably 0.5% by mass or less, even more preferably 0.2% by mass or less, and particularly preferably 0.15% by mass or less with reference to the polishing composition. When these ranges are satisfied, impurities (defects) on the surface of the object to be polished after polishing can be sufficiently removed.

The electrical conductivity of the polishing composition according to the present invention is not particularly limited, but is preferably 0.5 to 30 mS/cm, from the viewpoint of colloid stability. The electrical conductivity can be controlled by the usage of the electrical conductivity adjusting agent. A value measured by the method described in Examples is adopted as the electrical conductivity.

(Other Steps)

Examples of the other steps include a step of adding a dispersing medium, other components or the like to the second dispersion liquid; and a step of concentrating the second dispersion liquid.

Examples of the other components include a metal anticorrosive, an antiseptic agent, an antifungal agent, and a water-soluble polymer. These other components may be added in the step of preparing the first dispersion liquid and the step of preparing the second dispersion liquid, as long as the advantageous effect of the present invention will not be impaired.

<<Polishing Method>>

One embodiment of the present invention is a polishing method including obtaining a polishing composition by the above-described production method, and polishing the object to be polished using the polishing composition.

The object to be polished according to this embodiment is not particularly limited, and its examples include a metal, an object to be polished having oxygen atoms, and silicon atoms, an object to be polished having silicon-silicon bonds, and an objects to be polished having nitrogen atoms and silicon atoms.

Examples of the metal include copper, aluminum, hafnium, cobalt, nickel, titanium, and tungsten.

Examples of the object to be polished having oxygen atoms and silicon atoms include silicon oxide ($SiO_2$), and tetraethyl orthosilicate (TEOS) polycondensate.

Examples of the object to be polished having silicon-silicon bonds include polysilicon, amorphous silicon, single crystal silicon, n-type doped single crystal silicon, p-type doped single crystal silicon, and Si alloys such as SiGe.

Examples of the object to be polished having nitrogen atoms and silicon atoms include the objects to be polished having silicon-nitrogen bonds such as a silicon nitride film and SiCN (silicon carbon nitride).

These materials may be used alone or in combination of two or more of them.

The specific polishing method is not particularly limited, but, for example, the following method can be used.

The polishing instrument may be a common polishing instrument which is equipped with a holder for holding a substrate having the object to be polished and a motor whose rotation speed can be changed, and has a polishing table to which a polishing pad (polishing cloth) can be attached.

The polishing pad may be, for example a common non-woven fabric, polyurethane, or a porous fluorocarbon resin, without particular limitation. The polishing pad is preferably groove-processed for retaining the polishing liquid.

The polishing conditions are also not particularly limited; for example, the rotation speed of the polishing table (platen) is preferably 10 to 500 rpm, and the pressure applied to the substrate having the object to be polished (polishing pressure) is preferably 0.5 to 10 psi. The method for feeding the polishing composition to the polishing pad is also not particularly limited; for example, continuous feeding using a pump is used. The feeding amount is not limited, but the surface of the polishing pad is preferably always covered by the polishing composition of the present invention. The polishing time is also not particularly limited.

<<Surface Treatment Method>>

One embodiment of the present invention is a surface treatment method including obtaining a polishing composition by the above-described production method, and surface-treating an object to be polished after polishing using the polishing composition. In the present description, the surface treatment method means a method for reducing a foreign matter on the surface of an object to be polished after polishing, and a method of cleaning in a broad sense.

The surface treatment method of this embodiment is carried out by bringing the polishing composition according to the present invention into direct contact with the object to be polished after polishing.

Examples of the surface treatment method mainly include (I) a method containing rinse polishing treatment, and (II) a method containing cleaning treatment. That is, the surface treatment according to one embodiment of the present invention is preferably carried out by rinse polishing or cleaning. The rinse polishing treatment and cleaning treatment are carried out for removing a foreign matter (for example, particles, metal contamination, organic residues, or pad chippings) from the surface of the object to be polished after polishing, and obtaining a clean surface. The above-described (I) and (II) are further described below.

(I) Rinse Polishing Treatment

The polishing composition according to the present invention is suitable to rinse polishing treatment. The rinse polishing treatment is carried out, after final polishing (finishing polishing) of the object to be polished, for the purpose of removing foreign matter from the surface of the object to be polished, on the polishing table (platen) equipped with a polishing pad. At that time, rinse polishing treatment is carried out by bringing the polishing composition according to the present invention into direct contact with the object to be polished after polishing. As a result of this, the foreign matter on the surface of the object to be polished after polishing is removed by friction force (physical action) by the polishing pad and chemical action by the polishing composition. Among foreign matter, particularly, particles and organic residues are easily removed by physical action. Accordingly, in the rinse polishing treatment, particles and organic residues can be effectively removed by using friction with the polishing pad on the polishing table (platen).

Specifically, the rinse polishing treatment can be carried out by placing the surface of the object to be polished after polishing after the CMP process is placed on the polishing table (platen) of a polishing instrument, bringing the polishing pad into contact with the polished semiconductor substrate, and relatively sliding the object to be polished after polishing and the polishing pad while feeding the polishing composition to the touching part.

The rinse polishing treatment may use either of a one side polishing instrument or double side polishing instrument. The operation conditions during the rinse polishing treatment of the polishing instrument are not particularly limited, and can be established as appropriate by those skilled in the art.

(II) Cleaning Treatment

The polishing composition according to the present invention is suitable to cleaning treatment. The cleaning treatment is carried out, after final polishing (finishing polishing) of the object to be polished or after the rinse polishing treatment, for the purpose of removing foreign matter from the surface of the object to be polished after polishing. The cleaning treatment and the rinse polishing treatment are classified according to the point where these treatments are carried out; the cleaning treatment is surface treatment which is carried out after demounting the object to be polished after polishing from the polishing table (platen). Also in the cleaning treatment, the polishing composition according to the present invention is brought into direct contact with the object to be polished after polishing, whereby foreign matter on the surface of the object is removed.

Examples of the method for performing the cleaning treatment include (i) a method of bring a cleaning brush into contact with one side or both sides of the object to be polished after polishing with the object to be polished after polishing held, and rubbing the surface of the object to be cleaned with the cleaning brush while feeding the polishing composition to the touching part, and (ii) a method of performing ultrasonication or stirring by immersing the object to be polished after polishing in the polishing composition (dip process). In these methods, foreign matter on the object to be polished surface is removed by friction force by the cleaning brush or mechanical force generated by ultrasonication or stirring, and chemical action by the polishing composition.

In the (i) method described above, the method for bringing the polishing composition into contact with the object to be polished after polishing is not particularly limited, and examples include a spin method wherein the object to be polished after polishing is rotated at high speed while flowing the polishing composition from a nozzle on the object to be polished after polishing, and a spray method wherein the polishing composition is sprayed over the object to be polished after polishing for cleaning.

The cleaning treatment preferably uses the spin method or spray method, and more preferably by the spin method, for being capable of decontamination in a shorter time and more effectively.

Examples of the instrument for performing this cleaning treatment include a batch type cleaning instrument for simultaneously surface-treating plural pieces of objects to be polished after polishing contained in a cassette, and a sheet type cleaning instrument for surface-treating one piece of an object to be polished after polishing held in a holder. From the viewpoint of reducing the cleaning time or the like, the method using a sheet type cleaning instrument is preferred.

Furthermore, examples of the instrument for carrying tout cleaning treatment include a polishing instrument including cleaning equipment for rubbing the object to be polished after polishing with a cleaning brush after the object is removed from the polishing table (platen). The use of this polishing instrument allows more efficient cleaning treatment of the object to be polished after polishing.

Such polishing instrument may be a common polishing instrument including a holder for holding the object to be polished after polishing, a motor whose rotation speed can be changed, and a cleaning brush. The polishing instrument may be a one side polishing instrument or double-sided polishing instrument. If the rinse polishing process is carried out after the CMP process, the cleaning treatment is preferable performed by using a similar instrument to the polishing instrument used in the rinse polishing process because of efficiency.

The cleaning brush is not particularly limited, but is preferably a resin brush. The material of the resin brush is not particularly limited, but, for example, preferably uses PVA (polyvinyl alcohol). The cleaning brush is particularly preferably a PVA sponge.

The cleaning conditions are also not particularly limited, and may be established appropriately according to the type of the object to be cleaned, and the type and amount of the organic residues to be removed. For example, the rotation speed of the cleaning brush is preferably 10 rpm (60 rpm=1 $s^{-1}$, hereinafter the same) or more and 200 rpm or less, and the rotation speed of the object to be cleaned is preferably 10 rpm or more and 100 rpm or less. The method of feeding the polishing composition to the polishing pad is also not particularly limited, and, for example, a method of continuously feeding (pouring) with a pump can be adopted. The feeding amount is not particularly limited. It is preferably that the cleaning brush and the surface of the object to be cleaned are always covered with the polishing composition, and the feeding amount is preferably 10 mL/minute or more and 5000 mL/minute or less. The cleaning time is also not particularly limited, but the process using the polishing composition according to the present invention is preferably 5 seconds or more and 180 seconds or less. Within these ranges, foreign matter can be more effectively removed.

The temperature of the polishing composition during cleaning is not particularly limited; the temperature may be usually at room temperature, and the polishing composition may be heated to about 40° C. or higher and about 70° C. or lower as long as its performance will not be impaired.

In the (ii) method described above, the conditions of the cleaning method by immersion is not particularly limited, and a known method can be used.

Washing by water may be carried out before and/or after the cleaning treatment by the (i) and (ii) methods.

Additionally, the object to be polished after polishing after cleaning (the object to be cleaned) is preferably dried by wiping the water droplets off from the surface using a spin dryer or the like. Alternatively, the surface of the object to be cleaned may be dried by air blow drying.

The embodiments of the present invention are described in detail, but they are descriptive and exemplary, and not restrictive. It is evident that the scope of the invention should be interpreted by the attached claims.

The present invention includes the following aspects and embodiments.

1. A production method of a polishing composition including:

preparing a first dispersion liquid by mixing a dispersing element including abrasive grains and a dispersing medium with a pH adjusting agent, and changing a pH of the dispersing element so as to pass an isoelectric point of the abrasive grains; and preparing a second dispersion liquid by mixing the first dispersion liquid with an electrical conductivity adjusting agent.

2. The production method according to 1, wherein the electrical conductivity adjusting agent is in a form of an aqueous solution.

3. The production method according to 1 or 2, wherein the abrasive grains are silica particles.

4. The production method according to any one of 1 to 3, wherein the pH adjusting agent is an acidic compound.

5. The production method according to 4, wherein the electrical conductivity adjusting agent is a salt of the acidic compound.

6. The production method according to 1 or 2, wherein the pH adjusting agent is an alkaline compound.

EXAMPLES

The present invention is further described in detail using the following examples and comparative examples. However, the technical scope of the present invention will not be limited to the following examples. Unless otherwise specified, "%" and "parts" mean "% by mass" and "parts by mass", respectively. Additionally, in the following examples and comparative examples, unless otherwise specified, operations were carried out at room temperature (25° C.)/relative humidity 40 to 50% RH.

Example 1

To 800 g of colloidal silica (silica particle concentration: 20% by mass, isoelectric point: pH about 3.0, average secondary particle size: 70 nm, aqueous dispersing element, pH 7.0), 30 g of 85% by mass phosphoric acid aqueous solution as a pH adjusting agent was added, thereby preparing a first dispersion liquid having pH 1.4. Thereafter, to the first dispersion liquid, 20 g of diammonium hydrogen phosphate (solid) as an electrical conductivity adjusting agent was added, thereby preparing a second dispersion liquid. Ultrapure water was added to the second dispersion liquid, thereby preparing 10,000 g of polishing composition (pH 2.1).

The pH of the first dispersion liquid (liquid temperature: 25° C.) and the polishing composition (liquid temperature: 25° C.) was confirmed with a pH meter (Horiba, Ltd., glass electrode type hydrogen ion concentration indicator (model: F-23)).

The electrical conductivity (mS/cm) of the polishing composition (liquid temperature: 25° C.) was measured using a desktop electrical conductivity meter (Horiba, Ltd., model: DS-71).

The number of particles of 0.56 μm or larger contained in the polishing composition thus obtained was measured using AccuSizer (registered trademark) FX (U.S., Particle Sizing Systems).

Using the polishing composition thus obtained, the following objects to be polished were polished under the following polishing conditions.

Object to be Polished 300 mm blanket wafer: $SiO_2$ derived from tetraethyl orthosilicate (TEOS)

300 mm blanket wafer: copper (Cu)

Polishing Conditions

Polishing instrument: FREX300E (Ebara Corporation)

Polishing pad: hard polyurethane pad IC1400 (Nitta Haas Incorporated)

Polishing pressure: 2.0 psi (1 psi=6894.76 Pa, hereinafter the same)

Polishing table (platen) rotation speed: 60 [rpm]

Head (carrier) rotation speed: 60 [rpm]

Flow rate of polishing composition (slurry): 100 [ml/min]

Polishing time: 1 [min].

Washing Conditions

For the Cu blanket wafer and TEOS blanket wafer after polishing by the polishing method, each object to be polished after polishing was washed by a cleaning method of rubbing the objects to be polished after polishing by using an acidic surfactant (MCX SDR4, Mitsubishi Chemical Corporation) and applying a pressure with a polyvinyl alcohol (PVA) sponge as a cleaning brush under the following conditions Instrument: FREX300E (Ebara Corporation)

Washing brush rotation speed: 100 [rpm]

Rotation speed of object to be polished after polishing: 50 [rpm]

Type of cleaning composition: acidic surfactant (MCX SDR4 Mitsubishi Chemical Corporation)

Washing composition feeding amount: 1000 [ml/min]

Washing time: 1 [min].

Additionally, in each wafer after cleaning, the number of defects having a size of 0.13 μm or more (TEOS) or 0.20 μm or more (Cu) were measured using a wafer defect inspection instrument (SP-2, KLA-Tencor).

The measurement results are shown in Table 1.

Example 2

To 800 g of colloidal silica (silica particle concentration: 20% by mass, isoelectric point: pH about 3.0, average secondary particle size: 70 nm, aqueous dispersing element, pH 7.0), 30 g of 85% by mass phosphoric acid aqueous solution as a pH adjusting agent was added, thereby preparing a first dispersion liquid having pH 1.4. Thereafter, to the mixture, 2,000 g of 1% by mass diammonium hydrogen phosphate aqueous solution as an electrical conductivity adjusting agent was added, thereby preparing a second dispersion liquid. Ultrapure water was added to the second dispersion liquid, thereby preparing 10,000 g of polishing composition (pH 2.0).

In the same manner as in Example 1, the pH of the first dispersion liquid (liquid temperature: 25° C.) and the polishing composition (liquid temperature: 25° C.), the electrical conductivity of the polishing composition (liquid temperature: 25° C.), the number of particles of 0.56 μm or more and the number of defects contained in the polishing composition were measured. The measurement results are shown in Table 1.

Comparative Example 1

To 800 g of colloidal silica (silica particle concentration: 20% by mass, isoelectric point: pH about 3.0, average secondary particle size: 70 nm, aqueous dispersing element, pH 7.0), 20 g of diammonium hydrogen phosphate (solid) as an electrical conductivity adjusting agent was added, thereby preparing a mixture having pH 7.9. Thereafter, to the mixture, 30 g of 85% by mass of phosphoric acid aqueous solution as a pH adjusting agent was added, thereby preparing a dispersion liquid. Ultrapure water was added to the dispersion liquid, thereby preparing 10,000 g of polishing composition (pH 2.1).

In the same manner as in Example 1, the pH of the mixture (liquid temperature: 25° C.) and the polishing composition (liquid temperature: 25° C.), the electrical conductivity of the polishing composition (liquid temperature: 25° C.), the number of particles of 0.56 μm or more and the number of defects contained in the polishing composition were measured. The measurement results are shown in Table 1.

Comparative Example 2

To 800 g of colloidal silica (silica particle concentration: 20% by mass, isoelectric point: pH about 3.0, average secondary particle size: 70 nm, aqueous dispersing element, pH 7.0), 2,000 g of 1% by mass diammonium hydrogen phosphate aqueous solution as an electrical conductivity adjusting agent was added, thereby preparing a mixture having pH 7.9. Thereafter, to the mixture, 30 g of 85% by mass of phosphoric acid aqueous solution as a pH adjusting agent was added, thereby preparing a dispersion liquid. Ultrapure water was added to the dispersion liquid, thereby preparing 10,000 g of polishing composition (pH 2.0).

In the same manner as in Example 1, the pH of the mixture (liquid temperature: 25° C.) and the polishing composition (liquid temperature: 25° C.), the electrical conductivity of the polishing composition (liquid temperature: 25° C.), the number of particles of 0.56 μm or more and the number of defects contained in the polishing composition were measured. The measurement results are shown in Table 1.

Comparative Example 3

To 800 g of colloidal silica (silica particle concentration: 20% by mass, isoelectric point: pH about 3.0, average secondary particle size: 70 nm, aqueous dispersing element, pH 7.0), 30 g of 85% by mass phosphoric acid aqueous solution as a pH adjusting agent, and 20 g of diammonium hydrogen phosphate (solid) as an electrical conductivity adjusting agent were added, thereby preparing a dispersion liquid. Ultrapure water was added to the dispersion liquid, thereby preparing 10,000 q of polishing composition (pH 2.0).

In the same manner as in Example 1, the pH of the mixture (liquid temperature: 25° C.) and the polishing composition (liquid temperature: 25° C.), the electrical conductivity of the polishing composition (liquid temperature: 25° C.), the number of particles of 0.56 μm or more and the number of defects contained in the polishing composition were measured. The measurement results are shown in Table 1.

[Evaluation of Colloid Stability (Confirmation by Visual Observation)]

The polishing compositions obtained above were stored at 25° C. for one week. The condition of the polishing compositions before and after storage was confirmed by visual observation, and colloid stability was evaluated according to the following evaluation criteria. The results are shown in Table 1.

(Evaluation Criteria of Colloid Stability)
○: Condition of polishing composition did not change.
Δ: Degree of white turbidity of polishing composition increased.
x: Sedimentation of abrasive grains contained in the polishing composition occurred.

Specifically, Δ or x is considered as the results of reflecting aggregation of abrasive grains contained in the polishing compositions, and thus Δ or x is not preferred in terms of colloid stability.

TABLE 1

| | Polishing composition | | | | Number of defects | |
|---|---|---|---|---|---|---|
| | LPC (count/mL) | pH | Electrical conductivity (mS/cm) | Colloid stability | TEOS (0.13 μm or more) | Cu (0.20 μm or more) |
| Example 1 | 26592 | 2.1 | 4.2 | ○ | 12 | 42 |
| Example 2 | 20765 | 2.0 | 4.1 | ○ | 5 | 30 |
| Comparative Example 1 | 71919 | 2.1 | 4.0 | x | 34 | 512 |
| Comparative Example 2 | 58754 | 2.0 | 3.9 | x | 29 | 217 |
| Comparative Example 3 | 42554 | 2.0 | 4.0 | Δ | 26 | 117 |

LPC: number of particles of 0.56 μm or more

As indicated in Table 1, in the method for producing the polishing compositions according to Examples, the number of particles of 0.56 μm or more contained in the polishing compositions are smaller in comparison with the production method of polishing composition according to Comparative Examples, indicating that aggregation of silica particles can be suppressed. This is also indicated by the fact that the defects in polishing the objects to be polished were reduced in the polishing compositions obtained by the production method according to Examples.

Additionally, in Example 2, a salt of an acidic compound (diammonium hydrogen phosphate) was used in the form of an aqueous solution, whereby aggregation of silica particles was more suppressed in comparison with Example 1, indicating that the defects in polishing the object to be polished were more reduced.

It was also indicated that the production method of polishing composition according to Examples can suppress time-dependent aggregation of abrasive grains contained in the polishing composition in comparison with the production method of polishing composition according to Comparative Examples.

The present application is based on Japan patent Application No. 2017-181451 filed on Sep. 21, 2017, and the disclosure of which is entirely incorporated herein by reference.

What is claimed is:

1. A method for producing a polishing composition comprising:
   preparing a first dispersion liquid by mixing a dispersing element containing abrasive grains and a dispersing medium with a pH adjusting agent, and changing a pH of the dispersing element so as to pass an isoelectric point of the abrasive grains; and
   preparing a second dispersion liquid by mixing the first dispersion liquid with an electrical conductivity adjusting agent,
   wherein changing a pH of the dispersing element so as to pass an isoelectric point of the abrasive grains comprises:
   (i) when the pH of the dispersing element is higher than the isoelectric point of the abrasive grains, mixing the pH adjusting agent with the dispersing element, thereby making the pH of the dispersing element lower than the isoelectric point of the abrasive grains; or
(ii) when the pH of the dispersing element is lower than the isoelectric point of the abrasive grains, mixing the pH adjusting agent with the dispersing element, thereby making the pH of the dispersing element higher than the isoelectric point of the abrasive grains;
wherein the abrasive grains are silica;
wherein the pH of the dispersing element is changed to be lower than the isoelectric point of the silica; and
wherein the pH adjusting agent is phosphoric acid or acetic acid, and:
when the pH adjusting agent is phosphoric acid, the electrical conductivity adjusting agent is selected from diammonium hydrogen phosphate, ammonium dihydrogen phosphate, disodium hydrogen phosphate, sodium dihydrogen phosphate, dipotassium hydrogen phosphate, and potassium dihydrogen phosphate; or
when the pH adjusting agent is acetic acid, the electrical conductivity adjusting agent is selected from ammonium acetate, potassium acetate, and sodium acetate.

2. The production method according to claim 1, wherein the electrical conductivity adjusting agent is in the form of an aqueous solution.

3. The production method according to claim 1, wherein the abrasive grains are silica particles.

* * * * *